US012575087B2

(12) United States Patent
Liu et al.

(10) Patent No.: US 12,575,087 B2
(45) Date of Patent: Mar. 10, 2026

(54) SEMICONDUCTOR STRUCTURE AND MANUFACTURING METHOD THEREOF

(71) Applicant: CHANGXIN MEMORY TECHNOLOGIES, INC., Hefei City (CN)

(72) Inventors: Youming Liu, Hefei City (CN); Yi Jiang, Hefei City (CN); Deyuan Xiao, Hefei City (CN); Guangsu Shao, Hefei City (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 749 days.

(21) Appl. No.: 17/813,409

(22) Filed: Jul. 19, 2022

(65) Prior Publication Data

US 2023/0389281 A1 Nov. 30, 2023

Related U.S. Application Data

(63) Continuation of application No. PCT/CN2022/098247, filed on Jun. 10, 2022.

(30) Foreign Application Priority Data

May 31, 2022 (CN) .......................... 202210610533.6

(51) Int. Cl.
*H10B 12/00* (2023.01)

(52) U.S. Cl.
CPC ....... *H10B 12/482* (2023.02); *H10B 12/0335* (2023.02); *H10B 12/312* (2023.02); *H10B 12/488* (2023.02)

(58) Field of Classification Search
CPC .......................... H10B 12/0335; H10B 12/312; H10B 12/482; H10B 12/485; H10B 12/488
See application file for complete search history.

(56) References Cited

U.S. PATENT DOCUMENTS 5,386,132 A 1/1995 Wong
6,133,141 A * 10/2000 Kim .................. H01L 21/76802
438/668

(Continued)

FOREIGN PATENT DOCUMENTS

CN 1458683 A 11/2003
CN 1499639 A 5/2004
(Continued)

OTHER PUBLICATIONS

European Patent Office, Extended European Search Report Issued in Application No. 22924558.4, Sep. 10, 2024, Germany, 8 pages.
(Continued)

*Primary Examiner* — Britt Hanley
*Assistant Examiner* — Kevin Quinto
(74) *Attorney, Agent, or Firm* — Kilpatrick Townsend & Stockton LLP

(57) ABSTRACT

The present disclosure provides a semiconductor structure and a manufacturing method thereof, and relates to the technical field of semiconductors. The semiconductor structure includes: a substrate, a first stacked structure is disposed on the substrate, and includes a memory cell array; a plurality of word lines (WLs), arranged at intervals and extending along a first direction; a plurality of bit lines (BLs), arranged at intervals and extending along a second direction, one end of each of the plurality of BLs away from the memory cell array forms a step in the first direction, each BL is provided with a groove on a surface of the step, and the second direction and the first direction cross each other; and a plurality of BL plugs, arranged at intervals and extending along the first direction, one end of each BL plug is correspondingly disposed in the groove of one of the BLs.

5 Claims, 8 Drawing Sheets

(56) References Cited

U.S. PATENT DOCUMENTS

| | | | |
|---|---|---|---|
| 6,459,112 B1* | 10/2002 | Tsuboi | H10B 12/0335 |
| | | | 257/532 |
| 6,756,652 B2 | 6/2004 | Yano et al. | |
| 6,815,300 B2 | 11/2004 | Jeong et al. | |
| 8,309,416 B2 | 11/2012 | Park et al. | |
| 10,515,981 B2 | 12/2019 | Or-Bach et al. | |
| 11,145,765 B2 | 10/2021 | Chung et al. | |
| 11,201,213 B2 | 12/2021 | Chen | |
| 11,398,492 B2 | 7/2022 | Yan et al. | |
| 11,411,007 B2 | 8/2022 | Lee et al. | |
| 11,723,191 B2 | 8/2023 | Choi et al. | |
| 11,765,892 B2 | 9/2023 | Young et al. | |
| 11,839,085 B2 | 12/2023 | Yin et al. | |
| 2003/0002359 A1 | 1/2003 | Kieslich | |
| 2003/0139011 A1 | 7/2003 | Cleeves et al. | |
| 2005/0001253 A1* | 1/2005 | Sugimura | H01L 21/76838 |
| | | | 257/E21.585 |
| 2006/0240622 A1 | 10/2006 | Lee et al. | |
| 2007/0228427 A1 | 10/2007 | Matsui et al. | |
| 2012/0161229 A1 | 6/2012 | Kwon et al. | |
| 2012/0168848 A1 | 7/2012 | Ahn | |
| 2012/0175607 A1 | 7/2012 | Shu et al. | |
| 2013/0052803 A1 | 2/2013 | Roizin et al. | |
| 2013/0264621 A1 | 10/2013 | Nishi et al. | |
| 2013/0320433 A1 | 12/2013 | Cho et al. | |
| 2015/0228623 A1 | 8/2015 | Oh et al. | |
| 2019/0103407 A1 | 4/2019 | Kim et al. | |
| 2019/0198675 A1 | 6/2019 | Sharma et al. | |
| 2019/0252386 A1* | 8/2019 | Lee | H10B 12/50 |
| 2020/0043941 A1 | 2/2020 | Kim et al. | |
| 2020/0083225 A1 | 3/2020 | Ma et al. | |
| 2020/0227416 A1 | 7/2020 | Lilak et al. | |
| 2020/0251151 A1 | 8/2020 | Kang et al. | |
| 2020/0266113 A1 | 8/2020 | Tsugawa | |
| 2020/0381450 A1 | 12/2020 | Lue et al. | |
| 2021/0020747 A1 | 1/2021 | Chen | |
| 2021/0151437 A1 | 5/2021 | Tomishima | |
| 2021/0159229 A1 | 5/2021 | Gomes et al. | |
| 2021/0257366 A1 | 8/2021 | Lee | |
| 2021/0296320 A1 | 9/2021 | Sandhu | |
| 2021/0375875 A1 | 12/2021 | Brewer et al. | |
| 2021/0375926 A1 | 12/2021 | Mehandru et al. | |
| 2022/0005809 A1 | 1/2022 | Kim et al. | |
| 2022/0028882 A1 | 1/2022 | Lee | |
| 2022/0085023 A1 | 3/2022 | Shin et al. | |
| 2022/0130856 A1 | 4/2022 | Kim et al. | |
| 2022/0157819 A1 | 5/2022 | Jung et al. | |
| 2023/0103593 A1 | 4/2023 | Sakuma et al. | |
| 2023/0363143 A1 | 11/2023 | Lee et al. | |
| 2023/0389261 A1 | 11/2023 | Liu | |

FOREIGN PATENT DOCUMENTS

| | | | |
|---|---|---|---|
| CN | 102034759 A | 4/2011 | |
| CN | 102544016 A | 7/2012 | |
| CN | 107623033 A | 1/2018 | |
| CN | 108401468 A | 8/2018 | |
| CN | 108428703 A | 8/2018 | |
| CN | 110875315 A | 3/2020 | |
| CN | 110890371 A | 3/2020 | |
| CN | 112466881 A | 3/2021 | |
| CN | 112838088 A | 5/2021 | |
| CN | 113424319 A | 9/2021 | |
| CN | 113889473 A | 1/2022 | |
| CN | 113972213 A | 1/2022 | |
| CN | 114334980 A | 4/2022 | |
| CN | 114373760 A | 4/2022 | |
| CN | 114429944 A | 5/2022 | |
| CN | 114446963 A | 5/2022 | |
| CN | 114497055 A | 5/2022 | |
| EP | 3826058 A1 | 5/2021 | |
| JP | 2005252283 A | 9/2005 | |
| KR | 20090118299 A | 11/2009 | |
| KR | 20190038223 A | 4/2019 | |
| KR | 20220059424 A | 5/2022 | |
| TW | 202118058 A | 5/2021 | |
| TW | 202205539 A | 2/2022 | |
| TW | 202218129 A | 5/2022 | |
| WO | 2019204795 A1 | 10/2019 | |

OTHER PUBLICATIONS

European Patent Office, Extended European Search Report Issued in Application No. 22924572.5, Jul. 23, 2024, Germany, 8 pages.

Non-final office action issued in U.S. Appl. No. 17/816,156 mailed on Apr. 9, 2025, 15 pages.

Non-final office action issued in U.S. Appl. No. 17/816,435 mailed on Apr. 2, 2025, 14 pages.

Non-final office action issued in U.S. Appl. No. 17/816,130 mailed on May 14, 2025, 20 pages.

Non-final office action issued in U.S. Appl. No. 17/887,526 mailed on Apr. 11, 2025, 11 pages.

Taiwan Patent Office, Office Action Issued in Application No. 112119290, Apr. 9, 2024, 4 pages.

Korean Intellectual Property Office, Office Action Issued in Application No. 10-2023-7027118, Apr. 16, 2024, 13 pages.

International Search Report cited in PCT/CN2022/098247 mailed Dec. 19, 2022, 9 pages.

International Search Report cited in PCT/CN2022/098020 mailed Dec. 19, 2022, 9 pages.

International Search Report cited in PCT/CN2022/098018 mailed Dec. 28, 2022, 8 pages.

International Search Report cited in PCT/CN2022/098017 mailed Dec. 19, 2022, 9 pages.

International Search Report cited in PCT/CN2022/097528 mailed Dec. 16, 2022, 8 pages.

International Search Report cited in PCT/CN2022/098249 mailed Dec. 26, 2022, 9 pages.

Final Office Action issued in U.S. Appl. No. 17/816,435 mailed on Aug. 22, 2025, 13 pages.

Xinlv Duan et al., Novel Vertical Channel-All-Around (CAA) In—Ga—Zn—O FET for 2TOC-DRAM With High Density Beyond 4F2 by Monolithic Stacking, IEEE Transactions on Electron Devices, 69(4): 2196-2202, 2022.

* cited by examiner

B-B

C-C

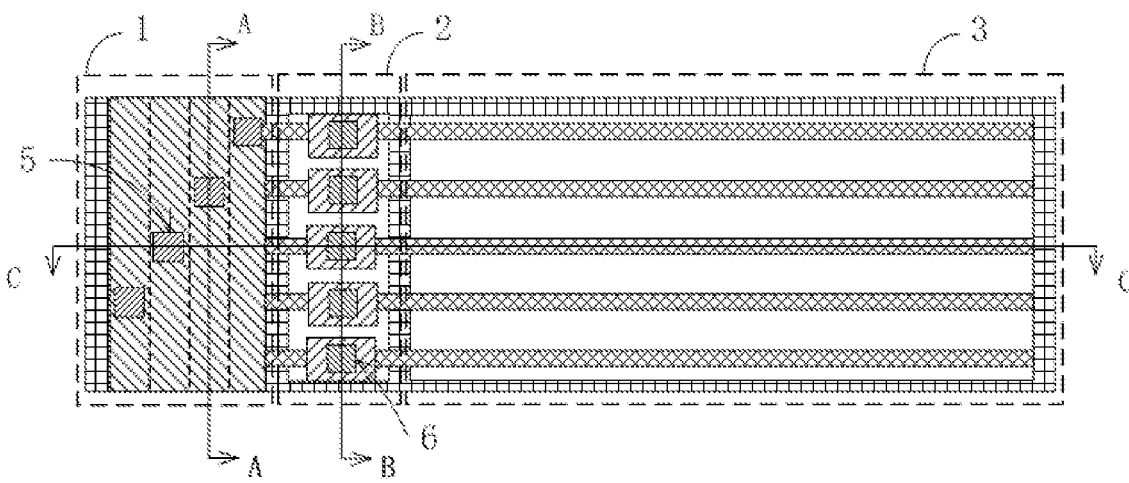

FIG. 5

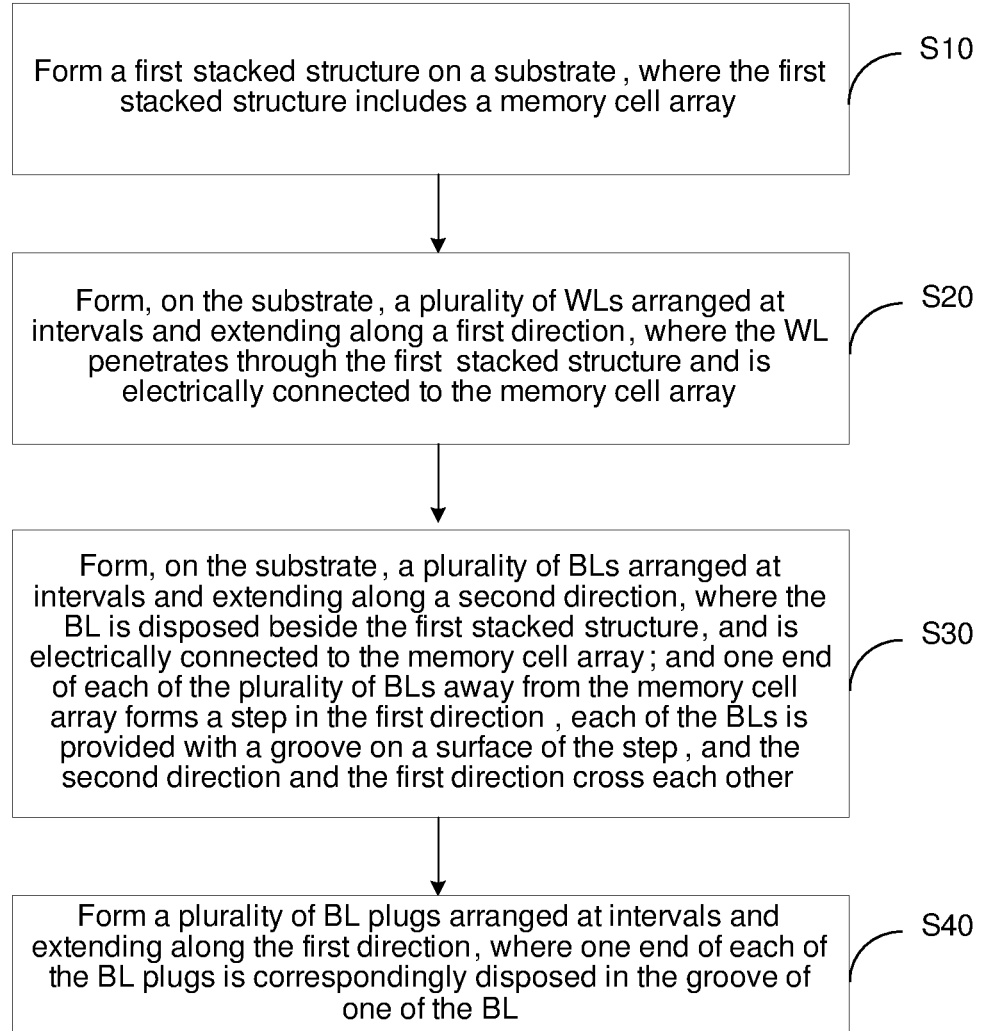

| Form a first stacked structure on a substrate, where the first stacked structure includes a memory cell array | S10 |

| Form, on the substrate, a plurality of WLs arranged at intervals and extending along a first direction, where the WL penetrates through the first stacked structure and is electrically connected to the memory cell array | S20 |

| Form, on the substrate, a plurality of BLs arranged at intervals and extending along a second direction, where the BL is disposed beside the first stacked structure, and is electrically connected to the memory cell array; and one end of each of the plurality of BLs away from the memory cell array forms a step in the first direction, each of the BLs is provided with a groove on a surface of the step, and the second direction and the first direction cross each other | S30 |

| Form a plurality of BL plugs arranged at intervals and extending along the first direction, where one end of each of the BL plugs is correspondingly disposed in the groove of one of the BL | S40 |

SEMICONDUCTOR STRUCTURE AND MANUFACTURING METHOD THEREOF

CROSS-REFERENCE TO RELATED APPLICATIONS

The present disclosure is a continuation application of International Patent Application No. PCT/CN2022/098247, filed on Jun. 10, 2022, which claims the priority to Chinese Patent Application 202210610533.6, titled "SEMICON-DUCTOR STRUCTURE AND MANUFACTURING METHOD THEREOF" and filed with the China National Intellectual Property Administration (CNIPA) on May 31, 2022. The entire contents of International Patent Application No. PCT/CN2022/098247 and Chinese Patent Application 202210610533.6 are incorporated herein by reference.

TECHNICAL FIELD

The present disclosure relates to the technical field of semiconductors, and in particular to a semiconductor structure and a manufacturing method thereof.

BACKGROUND

With the development of semiconductor technologies, the memory, especially a dynamic random access memory (DRAM) is widely used in various electronic devices due to its high storage density and fast reading and writing speed.

The DRAM usually includes a plurality of memory cells. Each memory cell includes a transistor and a capacitor. A gate of the transistor is electrically connected to a word line (WL) of the DRAM. The on and off of the transistor is controlled by the voltage on the WL. One of a source and a drain of the transistor is electrically connected to a bit line (BL), and the other is electrically connected to the capacitor. Data information is stored or outputted by using the BL.

To reduce the size of the memory and increase its storage density, the capacitor is usually placed horizontally, which facilitates manufacturing a capacitor with a larger slenderness ratio. Correspondingly, the transistor is also placed horizontally, and the transistor is led out to a BL plug through the BL to be electrically connected to a peripheral circuit. However, the contact resistance between the BL and the BL plug is large.

SUMMARY

According to some embodiments, a first aspect of the present disclosure provides a semiconductor structure, including: a substrate, where a first stacked structure is disposed on the substrate, and the first stacked structure includes a memory cell array; a plurality of WLs, arranged at intervals and extending along a first direction, where the WL penetrates through the first stacked structure and is electrically connected to the memory cell array; a plurality of BLs, arranged at intervals and extending along a second direction, where the BL is disposed beside the first stacked structure, and is electrically connected to the memory cell array; and one end of each of the plurality of BLs away from the memory cell array forms a step in the first direction, each of the BLs is provided with a groove on a surface of the step, and the second direction and the first direction cross each other; and a plurality of BL plugs, arranged at intervals and extending along the first is direction, where one end of each of the BL plugs is correspondingly disposed in the groove of one of the BLs.

According to some embodiments, a second aspect of the present disclosure provides a manufacturing method of a semiconductor structure, including:

forming a first stacked structure on a substrate, where the first stacked structure includes a memory cell array;

forming, on the substrate, a plurality of WLs arranged at intervals and extending along a first direction, where the WL penetrates through the first stacked structure and is electrically connected to the memory cell array;

forming, on the substrate, a plurality of BLs arranged at intervals and extending along a second direction, where the BL is disposed beside the first stacked structure, and is electrically connected to the memory cell array; and one end of each of the plurality of BLs away from the memory cell array forms a step in the first direction, each of the BLs is provided with a groove on a surface of the step, and the second direction and the first direction cross each other; and forming a plurality of BL plugs arranged at intervals and extending along the first direction, where one end of each of the BL plugs is correspondingly disposed in the groove of one of the BLs.

BRIEF DESCRIPTION OF THE DRAWINGS

FIG. 5 is another wire frame of the semiconductor structure according to an embodiment of the present disclosure;

FIG. 6 is a flowchart of a manufacturing method of a semiconductor structure according to an embodiment of the present disclosure;

DETAILED DESCRIPTION

Figure 1:
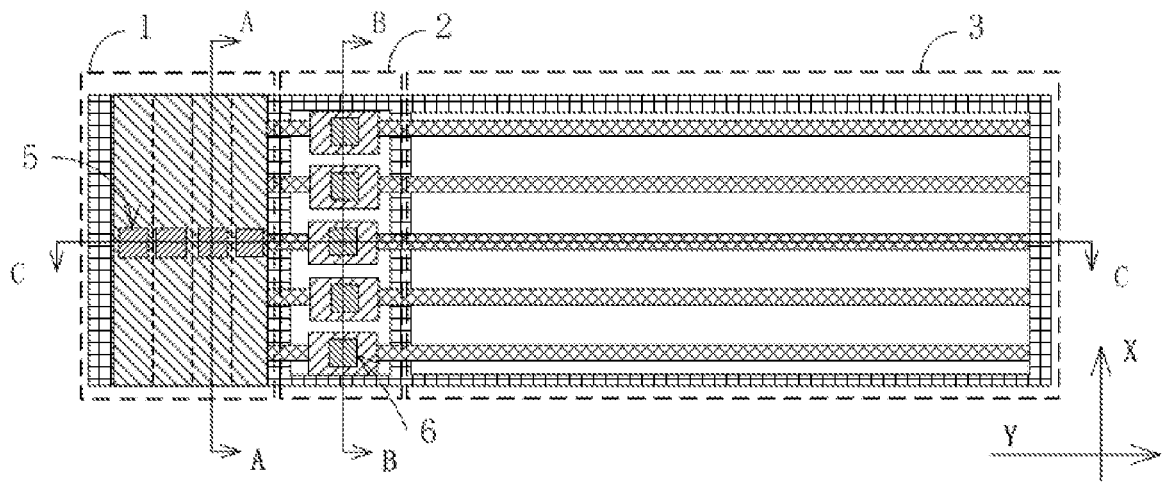
FIG. 1 is a wire frame of a semiconductor structure according to an embodiment of the present disclosure.

In the related art, the transistor and capacitor are placed horizontally. To connect the transistor to the peripheral circuit, a stepped BL is usually formed at one end of the transistor, and then a BL plug in contact with it is formed on the stepped BL. The BL and the peripheral circuit are electrically connected through the BL plug. The extension direction of the BL and the extension direction of the BL plug are usually perpendicular. The contact area between the BL and the BL plug is limited, resulting in a high contact resistance between the BL and the BL plug, thus reducing the performance of the semiconductor structure. In addition, in the stepped BLs, the BL is of a horizontal structure, and an insulating material fills a space between the upper BL and the lower BL. Therefore, in a normal process, it is difficult to dope the entire BL. As a result, the BL resistance is relatively large, the signal propagation speed is decreased, and the overall performance of the transistor is affected, thus decreasing the performance of the semiconductor structure.

In view of this, embodiments of the present disclosure provide a semiconductor structure and a manufacturing method thereof. In a case that the thicknesses of the BLs are kept consistent on the whole, a groove is formed on a surface of the step of a BL, and one end of a BL plug is correspondingly disposed in the groove of one BL, to increase the contact area between the BL and the BL plug, and reduce the contact resistance between the BL and the BL plug, thereby improving the performance of the semiconductor structure. In addition, a structure filling a space between BLs is subsequently removed through an etching process, to make the BL suspended. The BL is doped through a vapor doping process, to further reduce the resistance of the BL, and further improve the performance of the semiconductor.

To make the objectives, features and advantages of the embodiments of the present disclosure clearer, the technical solutions in the embodiments of the present disclosure are described clearly and completely below with reference to the drawings in the embodiments of the present disclosure. Apparently, the described embodiments are merely some rather than all of the embodiments of the present disclosure. All other embodiments obtained by those of ordinary skill in the art based on the embodiments of the disclosure without creative efforts shall fall within the protection scope of the present disclosure.

A first aspect of the embodiments of the present disclosure provides a semiconductor structure. The semiconductor structure may be a memory device or a non-memory device. The memory device may include, for example, a DRAM, a static random access memory (SRAM), a flash memory, an electrically erasable programmable read-only memory (EEPROM), a phase change random access memory (PRAM), or a magneto-resistive random access memory (MRAM). The non-memory device may be a logic device, such as, a microprocessor, a digital signal processor, or a microcontroller, or a similar device. In the embodiments of the present disclosure, description is made by using the DRAM as an example.

With reference to FIGS. 1 to 4, the semiconductor structure includes a substrate 10, a WL 4, a BL 1, and a BL plug 5. The substrate 10 can support the structure layers thereon. The substrate 10 may be made of a semiconductor, such as, monocrystalline silicon, polycrystalline silicon, amorphous silicon, germanium, silicon carbide, silicon germanium, germanium on insulator (GOI) or silicon on insulator (SOI).

A first stacked structure is disposed on the substrate 10. The first stacked structure includes a memory cell array configured to store data. The BL 1 penetrates through the first stacked structure and is electrically connected to the memory cell array. The WL 4 penetrates the first stacked structure and is electrically connected to the memory cell array. The BL plug 5 is in contact with and is electrically connected to the BL 1. The WL 4 is configured to open or close the memory cell array. The BL 1 is configured to write data information into the memory cell array, or read the data information of the memory cell array. The BL plug 5 is configured to electrically connect the BL 1 to a peripheral circuit.

In some possible embodiments, the memory cell array includes a plurality of transistors 2, and the plurality of transistors 2 are arranged at intervals along the first direction and the second direction, and each transistor extends along a third direction. The third direction is perpendicular to both of the first direction and the second direction.

Specifically, with reference to FIGS. 1 to 4, the memory cell array includes a plurality of transistors 2, and each transistor 2 extends along the third direction. The plurality of transistors 2 are arranged in an array. The plurality of transistors 2 are arranged at intervals not only along the first direction, but also along the second direction. The third direction is the direction parallel to the substrate 10, that is, the direction Y shown in FIG. 1. The first direction is the direction perpendicular to the substrate 10, that is, the direction Z shown in FIG. 3. The first direction and the second direction cross each other, and the first direction and the second direction are both perpendicular to the third direction.

In some possible examples, any two of the first direction, the second direction, and the third direction are perpendicular to each other. For example, the second direction is the direction X shown in FIG. 3, and the third direction is the direction Y shown in FIG. 1. Though such a disposal, the plurality of transistors 2 can be arranged more compact in a better manner, the arrangement quantity of the transistors 2 can be maximized, thereby improving storage density of the memory cell array.

Figure 3:
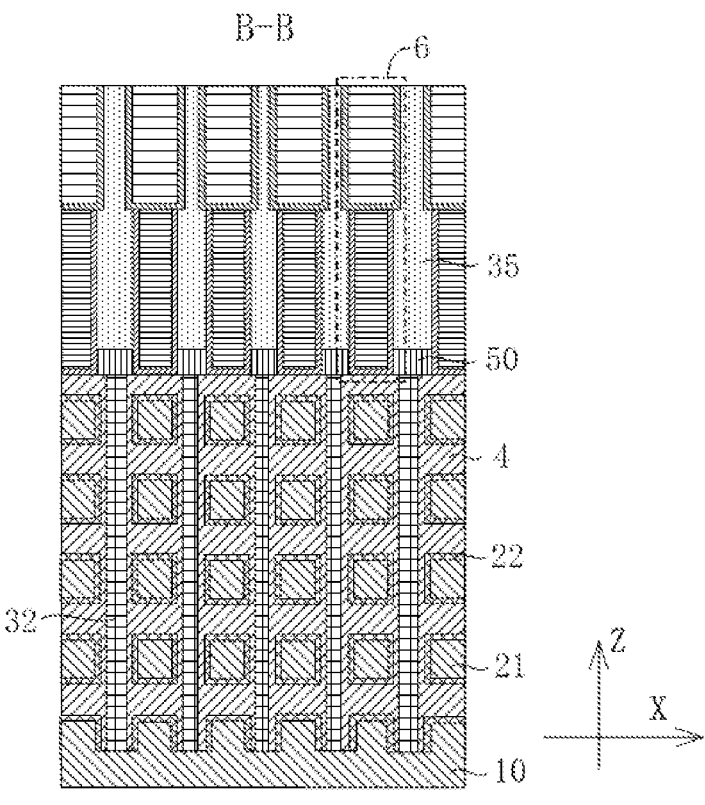
FIG. 3 is a schematic structural diagram of a cross section taken along B-B in the semiconductor structure according to an embodiment of the present disclosure.
Figure 4:
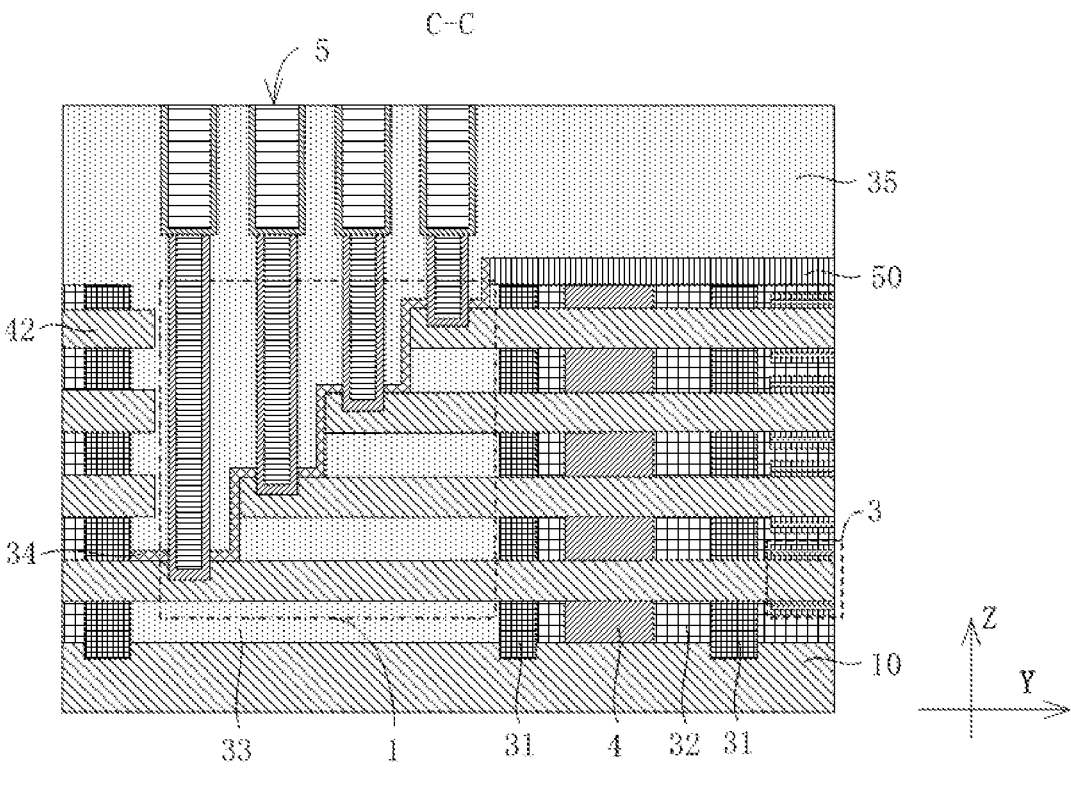
FIG. 4 is a schematic structural diagram of a cross section taken along C-C in the semiconductor structure according to an embodiment of the present disclosure.

In some possible embodiments, with reference to FIGS. 3 and 4, the transistor 2 includes a source, a drain, a channel 21, a dielectric layer 22, and a gate. One of the source and the drain is electrically connected to the BL 1. For example, the source is electrically connected to the BL 1. The channel 21 is located between the source and the drain, and two ends of the channel 21 are in contact with the source and the drain respectively. The source, the channel 21, and the drain are arranged sequentially along the third direction. The gate is located on the outer peripheral side of the channel 21 and is electrically connected to the WL 4. A dielectric layer 22 is disposed between the gate and the channel 21.

In some possible implementations, the WL 4 surrounds the outer peripheral side of each channel 21, which is integrated along the first direction. The WL 4 is used as the gate of the transistor 2. The dielectric layer 22 is disposed between the WL 4 and each channel 21, that is, the dielectric layer 22 covers the outer peripheral side of the channel 21, and the WL 4 covers the outer peripheral side of the dielectric layer 22. The material of the WL 4 may be metal such as titanium nitride, and the material of the dielectric layer 22 may be silicon oxide.

In the foregoing embodiments, taking a plane perpendicular to the third direction as a cross section, the cross section of the channel 21 may be in a shape of a circle, an ellipse, a square, a rectangle, a pentagon, or the like, which is not limited in the embodiments of the present disclosure. The cross-sectional shapes of the channel 21, the source, and the drain may be same and adapted to make the contact area between the channel 21 and the source, and the channel 21, and the drain larger.

It can be seen from FIGS. 3 and 4 that the transistor 2 is a vertical gate-all-around (GAA) transistor. Because the feature size of the vertical GAA transistor is small, the substrate 10 with a same area can accommodate more GAA transistors, which can improve the integration of the semiconductor structure. In this case, the gate can control the channel 21 on all sides, which improves the ability of controlling the channel 21 and is the short channel effect, and reduces the operation voltage, thereby improving the performance of the semiconductor structure.

In some possible embodiments, with reference to FIGS. 1 and 4, the memory cell array further includes a plurality of capacitors 3. The plurality of capacitors 3 are electrically connected to the other ones of the sources and the drains of the plurality of transistors 2 in a one-to-one correspondence. The plurality of capacitors 3 extend along the third direction and are arranged at intervals, that is, the capacitors 3 are placed horizontally on the substrate 10. The plurality of capacitors 3 are electrically connected to the plurality of transistors 2 in a one-to-one correspondence. Each capacitor 3 is electrically connected to one transistor 2. Specifically, one of the source and drain of the transistor 2 is connected to the BL 1, and the other is connected to the capacitor 3. For example, the source of the transistor 2 is electrically connected to the BL 1, and the drain of the transistor 2 is electrically connected to the capacitor 3.

In some possible embodiments, with reference to FIGS. 1, 3, and 4, the first stacked structure further includes: a plurality of support layers 31, where the support layer 31 is disposed between two adjacent rows of transistors 2 along the first direction; and an isolation layer 32, where the isolation layer 32 fills the remaining space of the first stacked structure. The support layer 31 is disposed, to support the transistor 2, to prevent it from collapsing, and facilitate the stacking of the transistors 2 in the first direction. The isolation layer 32 is disposed to electrically isolate the structures in the memory cell array and prevent the structures in the memory cell array from interfering with each other.

Specifically, the support layer 31 is disposed between sources of two adjacent rows of transistors 2, and between drains of two adjacent rows of transistors 2. With reference to FIG. 4, the support layer 31 is disposed between sources of two adjacent rows of transistors 2 along the first direction, and between drains of two adjacent rows of transistors 2. The support layers 31 disposed in a same layer have gaps along the third direction. The support layers 31 are disposed at two ends of the transistor 2, to stably support the transistor 2 and facilitate the formation of the channel 21, the dielectric layer 22 and the gate of the transistor 2. The material of the support layer 31 may be a material that is relatively hard, and is unlikely to collapse or not easy to etch, for example, silicon oxynitride or silicon nitride, to improve the stability of the first stacked structure.

With reference to FIGS. 1, 3, and 4, the isolation layer 32 fills the remaining space of the first stacked structure. Specifically, the isolation layer 32 fills a space in the memory cell array, to electrically isolate the structures in the memory cell array. As shown in FIGS. 3 and 4, the isolation layer 32 fills a space between adjacent transistors 2, to prevent the transistors 2 from interfering with each other. The isolation layer 32 further fills a space between adjacent capacitors 3, to prevent them from interfering with each other. The isolation layer 32 filling a space between adjacent transistors 2 and the isolation layer 32 filling a space between adjacent capacitors 3 may be made of a same material or not. For example, the isolation layer 32 filling a space between adjacent transistors 2 may be made of silicon oxide, and the isolation layer 32 filling a space between adjacent capacitors 3 may be made of silicon oxynitride.

In some possible embodiments, with reference to FIGS. 1 to 4, in the embodiments of the present disclosure, a plurality of WLs 4 are provided, extend along the first direction (the direction Z in FIG. 3), and are arranged at intervals along the second direction (the direction X in FIG. 3). The isolation layer 32 fills a space between adjacent WLs 4, to ensure that adjacent WLs 4 are electrically isolated, and prevent the WLs 4 from interfering with each other.

The WL 4 penetrates through the first stacked structure and is electrically connected to the memory cell array. Specifically, each of the WLs 4 surrounds the plurality of channels 21 located in a same column along the first direction, and serves as the gate of the transistor 2. As shown in FIGS. 1 to 4, each WL 4 extends along the first direction, and surrounds each channel 21 by which it passes. The dielectric layer 22 fills a space between the WL 4 and a corresponding channel 21. In such a manner, the arrangement of the WLs 4 can be optimized, and the WLs occupy a smaller space, to increase the quantities of the transistors 2 and the capacitors 3 in the memory cell array, thereby improving the storage density of the semiconductor structure.

Figure 2:
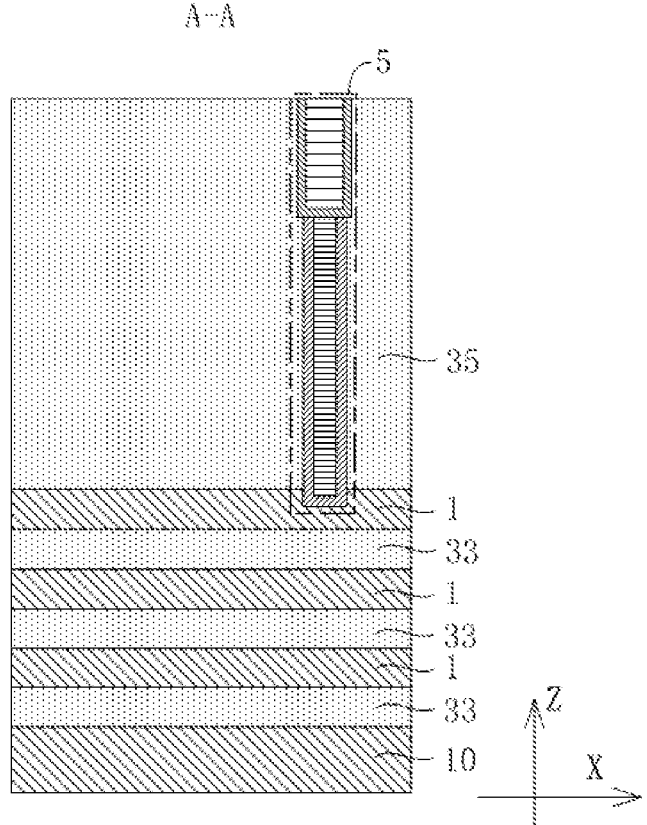
FIG. 2 is a schematic structural diagram of a cross section taken along A-A in the semiconductor structure according to an embodiment of the present disclosure.

In some possible embodiments, with reference to FIGS. 1 to 4, in the embodiments of the present disclosure, a plurality of BLs 1 are provided, extend along the second direction (the direction X in FIG. 2), and are stacked along the first direction (the direction is Z in FIG. 2). In addition, adjacent BLs 1 are electrically isolated. Specifically, the plurality of BLs 1 are arranged at intervals along the first direction, so as to electrically isolate adjacent BLs 1. Further, a first insulating layer 33 may also fill a space between adjacent BLs 1, that is, the BL 1 and the first insulating layer 33 are stacked sequentially and alternately along the first direction. The first insulating layer 33 can not only isolate the BLs 1, but also support the BLs 1, to improve the stability of the BL 1.

The BL 1 is disposed beside the first stacked structure and is electrically connected to the memory cell array. Specifically, as shown in FIGS. 1 and 4, the BL 1 is located at the left side of the first stacked structure. Each BL 1 connects a plurality of drains located in the same row along the second direction. In such a manner, the arrangement of the BLs 1 can be optimized, and the BLs occupy a smaller space, to increase the quantities of the transistors 2 and the capacitors 3 in the memory cell array, thereby improving the storage density of the semiconductor structure.

With reference to FIG. 4, one end of each of the plurality of BLs 1 away from the memory cell array forms a step in the first direction. Specifically, the lengths of the plurality of BLs 1 are successively decreased along the direction away from the substrate 10, such that the plurality of BLs 1 form steps. In every two adjacent BLs 1, a partial region of the BL 1 close to the substrate 10 is exposed, and is not blocked by the BL 1 away from the substrate 10, such that a BL plug 5 is formed in the exposed partial region of the BL 1, thereby electrically connecting the BL 1 to the peripheral circuit.

Each BL 1 is provided with a groove 23 on the surface of the step. As shown in FIG. 4, the left ends of the plurality of BLs 1 form steps, and the steps are upward along the first direction. Each of the steps is provided with the groove 23. Taking the surface perpendicular to the substrate 10 as a cross section, the cross section of the groove 23 may be in a shape of a semi-circle, a semi-ellipse, a square, a trapezoid, or the like. The cross-sectional shape of the groove 23 is adapted to that of the BL plug 5, to enable the bottom wall and the sidewall of the groove 23 to be in contact with the BL plug 5, thereby increasing the contact area between the groove 23 and the BL plug 5.

The size of the bottom of the groove 23 is smaller than that of the opening of the groove 23 to facilitate the formation of the BL plug 5 in the groove 23. The bottom of the is groove 23 is located in the corresponding BL 1, and the groove 23 does not penetrate the BL 1. In this way, the exposed area of the BL 1 in the corresponding groove 23 is relatively large. The grooves 23 formed on the surfaces of the steps of the BLs 1 may be same. In this way, a plurality of grooves 23 can be manufactured at the same time, to simplify the manufacturing process of the semiconductor structure.

With reference to FIG. 4, in the embodiment of the present disclosure, a plurality of BL plugs 5 are provided, extend along the first direction, and are arranged at intervals along the third direction, such that the BL plugs 5 are isolated from each other, to prevent the BLs 1 from interfering with each other. The plurality of BL plugs 5 are electrically connected to the plurality of BLs 1 in a one-to-one correspondence, and one end of each BL plug 5 is disposed in its corresponding groove 23. Specifically, one end of the BL plug fills the groove 23. In this way, a contact area between the BL plug 5 and the BL 1 can be increased, thereby decreasing the contact resistance between the BL plug 5 and the BL 1, and improving the performance of the semiconductor structure.

In some possible implementations, with reference to FIG. 1, a plurality of BL plugs 5 are disposed in a same row along the third direction, and the plurality of BL plugs 5 occupy a small space along the second direction. With reference to FIG. 4, along a direction close to the transistor 2, the lengths of the plurality of BL plugs 5 are gradually reduced, such that the surfaces of the BL plugs 5 away from the substrate 10 are flush with each other, to connect the peripheral circuit.

In some other possible implementations, the plurality of BL plugs 5 are staggered along the second direction. With reference to FIG. 5, a connecting line of the plurality of BL plugs 5 and the second direction form an angle. In this way, the distance between adjacent BL plugs 5 is relatively large, and the mutual interference is small.

To further improve the performance of the semiconductor structure, at least one of the plurality of BLs 1 in the embodiment of the present disclosure is N-type doped or P-type doped, and the resistance of the N-type or P-type doped BL 1 is reduced, thereby reducing the resistance between the BL plug 5 and the transistor 2. In some possible examples, each BL 1 is N-type or P-type doped to reduce the resistance of each BL 1. In this way, because the lengths of the BLs 1 are different, and the resistance of each BL 1 is reduced, the loss on each BL 1 can be reduced, to make the operation states of the transistors 2 relatively consistent, and reduce the difference between the transistors 2, thereby improving the performance of the semiconductor structure. For example, each BL 1 is doped with phosphorus atoms, that is, each BL 1 is N-type doped.

In the foregoing embodiments, the BL 1 may be doped through a vapor doping process. Because the surface of the BL 1 is exposed, and especially two opposite surfaces of the BL 1 along the first direction are exposed, the two surfaces of the BL 1 may be doped simultaneously through the vapor doping, such that the BL 1 is doped deeper, to improve the doping efficiency and uniformity of the BL 1.

Based on the embodiment in which the semiconductor structure includes the first insulating layer 33 filling a space between two adjacent BLs 1, the semiconductor structure further includes a first protective layer 34 covering the BL 1 and the first insulating layer 33, and a second insulating layer 35 filling a space between two adjacent BL plugs 5 and covering the first stacked structure.

Specifically, with reference to FIG. 4, the first protective layer 34 covers the BL 1 and the first insulating layer 33, to prevent the surface of the BL 1 away from the substrate 10 from being exposed, and isolate and protect the BLs 1. The first protective layer 34 is formed in a stepped shape and may be made of silicon nitride or silicon oxynitride. The second insulating layer 35 fills a space between two adjacent BL plugs 5, to further ensure the insulating performance between the BL plugs 5. The second insulating layer 35 is made of silicon oxide.

With reference to FIG. 3, a plurality of WL plugs 6 are arranged at intervals in the second insulating layer 35, and the plurality of WL plugs 6 are electrically connected to the plurality of WLs 4 in a one-to-one correspondence. The WL plug 6 extends along the first direction and is configured to connect the WL 4 to the peripheral circuit. The WL 4 has a first surface and a second surface that are arranged oppositely along the first direction. The first surface is away from the substrate 10, and the second surface is close to the substrate 10. Each WL plug 6 is in contact with the first surface of the corresponding WL 4, such that each WL 4 is led out through a different WL plug 6.

In conclusion, in the semiconductor structure provided by the embodiments of the present disclosure, the groove 23 is provided on the surface of the BL 1, and one end of the BL plug 5 is correspondingly disposed in the groove 23 of the BL 1, to increase the contact area between the BL 1 and the BL plug 5, and reduce the contact resistance between the BL 1 and the BL plug 5, thereby improving the performance of the semiconductor structure.

With reference to FIG. 6, an embodiment of the present disclosure further provides a manufacturing method of a semiconductor structure, including the following steps:

Step S10: Form a first stacked structure on a substrate, where the first stacked structure includes a memory cell array.

The substrate 10 can support the structure layers thereon. The substrate 10 may be made of a semiconductor, such as, monocrystalline silicon, polycrystalline silicon, amorphous silicon, germanium, silicon carbide, silicon germanium, GOI, or SOI. A first stacked structure is disposed on the substrate 10. The first stacked structure includes a memory cell array, which is configured to store data.

In some possible embodiments, with reference to FIGS. 1 to 5, the memory cell array includes a plurality of transistors 2, and each transistor 2 extends along the third direction. The plurality of transistors 2 are arranged in an array. Specifically, the plurality of transistors 2 are arranged at intervals not only along the first direction, but also along the second direction. The first direction is the direction perpendicular to the substrate 10, that is, the direction Z shown in FIG. 3. The first direction and the second direction cross each other, and the first direction and the second direction are both perpendicular to the third direction.

In some possible examples, any two of the first direction, the second direction, and the third direction are perpendicular to each other. For example, the second direction is the direction X shown in FIG. 3, and the third direction is the direction Y shown in FIG. 4. Though such a disposal, the plurality of transistors 2 can be arranged more compact in a better manner, the arrangement quantity of the transistors 2 can be maximized, thereby improving storage density of the memory cell array.

In some possible embodiments, with reference to FIGS. 3 and 4, the transistor 2 includes a source, a drain, a channel 21, and a gate. The source, the channel 21, and the drain are arranged sequentially along the third direction. One of the source and the drain is electrically connected to the BL 1. For example, the source is electrically connected to the BL 1. The gate surrounds the outer peripheral side of the channel 21 and is electrically connected to the WL 4, and the dielectric layer 22 is also disposed between the gate and the channel 21.

In some possible embodiments, with reference to FIGS. 1 and 5, the memory cell array further includes a plurality of capacitors 3. The plurality of capacitors 3 are electrically connected to the other ones of the sources and the drains of the plurality of transistors 2 in a one-to-one correspondence. The plurality of capacitors 3 extend along the third direction and are arranged at intervals, that is, the capacitors 3 are placed horizontally on the substrate 10. The plurality of capacitors 3 are electrically connected to the plurality of transistors 2 in a one-to-one correspondence. Each capacitor 3 is electrically connected to one transistor 2. Specifically, one of the source and drain of the transistor 2 is connected to the BL 1, and the other is connected to the capacitor 3. For example, the source of the transistor 2 is electrically connected to the BL 1, and the drain of the transistor 2 is electrically connected to the capacitor 3.

Step S20: Form, on the substrate, a plurality of WLs arranged at intervals and extending along a first direction, where the WL penetrates through the first stacked structure and is electrically connected to the memory cell array.

With reference to FIGS. 1 to 4, in the embodiments of the present disclosure, a plurality of WLs 4 are provided, extend along the first direction (as shown in FIG. 3), and are arranged at intervals along the second direction (as shown in FIG. 3). The isolation layer 32 fills a space between adjacent WLs 4, to ensure that adjacent WLs 4 are electrically isolated, and prevent the WLs 4 from interfering with each other.

The WL 4 penetrates through the first stacked structure and is electrically connected to the memory cell array. Specifically, each WL 4 extends along the first direction, and surrounds each channel 21 by which it passes. The dielectric layer 22 fills a space between the WL 4 and a corresponding channel 21. In such a manner, the arrangement of the WLs 4 can be optimized, and the WLs occupy a smaller space, to increase the quantities of the transistors 2 and the capacitors 3 in the memory cell array, thereby improving the storage density of the semiconductor structure. In addition, the WL 4 may further be used as the gate of the transistor 2 to enable the transistor 2 to be a vertical GAA transistor. Because the feature size of the vertical GAA transistor is small, the substrate 10 with a same area can accommodate more GAA transistors, which can improve the integration of the semiconductor structure. In this case, the gate can control the channel 21 on all sides, which improves the ability of controlling the channel 21 and the short channel effect, and reduces the operation voltage, thereby improving the performance of the semiconductor structure.

In some possible embodiments, with reference to FIGS. 3, and 4, after the WLs 4 are formed, the method further includes: forming a plurality of support layers 31 and an isolation layer 32, where the support layer 31 is disposed between two adjacent rows of transistors 2 along the first direction; and the isolation layer 32 fills the remaining space of the first stacked structure. The support layer 31 is disposed, to support the transistor 2, to prevent it from collapsing, and facilitate the stacking of the transistors 2 in the first direction. The isolation layer 32 is disposed to electrically isolate the structures in the memory cell array and prevent the structures in the memory cell array from interfering with each other.

Specifically, the support layer 31 is formed between sources of two adjacent rows of transistors 2, and between drains of two adjacent rows of transistors 2. With reference to FIG. 4, the support layer 31 is disposed between sources of two adjacent rows of transistors 2 along the first direction, and between drains of two adjacent rows of transistors 2. The support layers have gaps along the third direction. The support layers 31 are disposed at two ends of the transistor 2, to stably support the transistor 2 and facilitate the formation of the channel 21 and the gate of the transistor 2. The material of the support layer 31 may be a material that is relatively hard, and is unlikely to collapse or not easy to etch, for example, silicon oxynitride or silicon nitride, to improve the stability of the first stacked structure.

With reference to FIGS. 3 and 4, the isolation layer 32 fills the remaining space of the first stacked structure. Specifically, the isolation layer 32 fills a space in the memory cell array, to electrically isolate the structures in the memory cell array. As shown in FIGS. 3 and 4, the isolation layer 32 fills a space between adjacent transistors 2, to prevent the transistors 2 from interfering with each other. The isolation layer 32 further fills a space between adjacent capacitors 3, to prevent them from interfering with each other. The isolation layer 32 filling a space between adjacent transistors 2 and the isolation layer 32 filling a space between adjacent capacitors 3 may be made of a same material or not. For example, the isolation layer 32 filling a space between adjacent transistors 2 may be made of silicon oxide, and the isolation layer 32 filling a space between adjacent capacitors 3 may be made of silicon oxynitride.

Step S30: Form, on the substrate, a plurality of BLs arranged at intervals and extending along a second direction, where the BL is disposed beside the first stacked structure, and is electrically connected to the memory cell array; and one end of each of the plurality of BLs away from the memory cell array forms a step in the first direction, each of the BLs is provided with a groove on a surface of the step, and the second direction and the first direction cross each other.

With reference to FIGS. 1 to 5, a plurality of BLs 1 are provided, extend along the second direction, and are stacked along the first direction. In addition, adjacent BLs 1 are electrically isolated. Specifically, the plurality of BLs 1 are arranged at intervals along the first direction, so as to electrically isolate adjacent BLs 1. The BL 1 is disposed beside the first stacked structure and is electrically connected to the memory cell array. Each BL 1 connects a plurality of drains located in the same row along the second direction. In such a manner, the arrangement of the BLs 1 can be optimized, and the BLs occupy a smaller space, to increase the quantities of the transistors 2 and the capacitors 3 in the memory cell array, thereby improving the storage density of the semiconductor structure.

With reference to FIG. 4, one end of each of the plurality of BLs 1 away from the memory cell array forms a step in the first direction. Specifically, the lengths of the plurality of BLs 1 are successively decreased along the direction away from the substrate 10, such that the plurality of BLs 1 form steps. In every two adjacent BLs 1, a partial region of the BL 1 close to the substrate 10 is exposed, and is not blocked by the BL 1 away from the substrate 10, such that a BL plug 5 is formed in the exposed partial region of the BL 1, thereby electrically connecting the BL 1 to the peripheral circuit.

Each BL 1 is provided with a groove 23 on the surface of the step. As shown in FIG. 4, the left ends of the plurality of BLs 1 form steps, and the steps are upward along the first direction. Each of the steps is provided with the groove 23. Taking the surface perpendicular to the substrate 10 as a cross section, the cross section of the groove 23 may be in a shape of a semi-circle, a semi-ellipse, a square, a trapezoid, or the like. The cross-sectional shape of the groove 23 is adapted to that of the BL plug 5, to enable the bottom wall and the sidewall of the groove 23 to be in contact with the BL plug 5, thereby increasing the contact area between the groove 23 and the BL plug 5. The size of the bottom of the groove 23 is smaller than that of the opening of the groove 23 to facilitate the subsequent formation of the BL plug 5 in the groove 23. The bottom of the groove 23 is located in the corresponding BL 1, and the groove 23 does not penetrate the BL 1. In this way, the exposed area of the BL 1 in the corresponding groove 23 is relatively large. The grooves 23 formed on the surfaces of the steps of the BLs 1 may be same. In this way, a plurality of grooves 23 can be manufactured at the same time, to simplify the manufacturing process of the semiconductor structure.

In some possible implementations, with reference to FIGS. 7 to 15, the step of forming, on the substrate 10, the plurality of BLs 1 arranged at intervals and extending along the second direction, where the BL 1 is disposed beside the first stacked structure, and is electrically connected to the memory cell array includes the following steps:

Step S31: Form a second stacked structure on the substrate, where the second stacked structure is located beside the first stacked structure; and the second stacked structure includes a first sacrificial layer and a first active layer that are disposed alternately.

Figure 7:
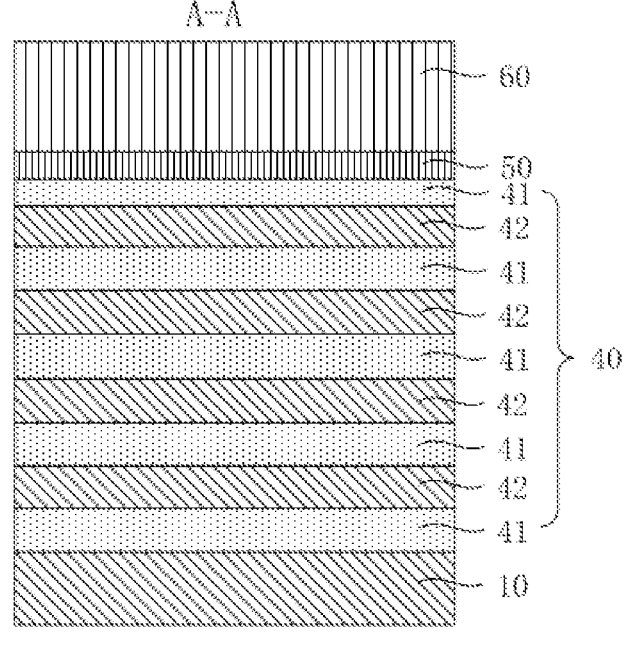
FIG. 7 is a schematic structural diagram of a cross section taken along A-A after a second stacked structure is formed according to an embodiment of the present disclosure.
Figure 8:
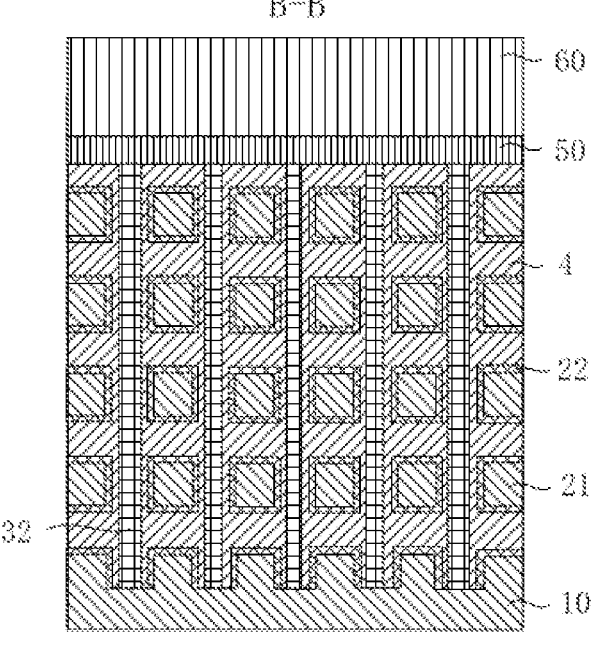
FIG. 8 is a schematic structural diagram of a cross section taken along B-B after the second stacked structure is formed according to an embodiment of the present disclosure.
Figure 9:
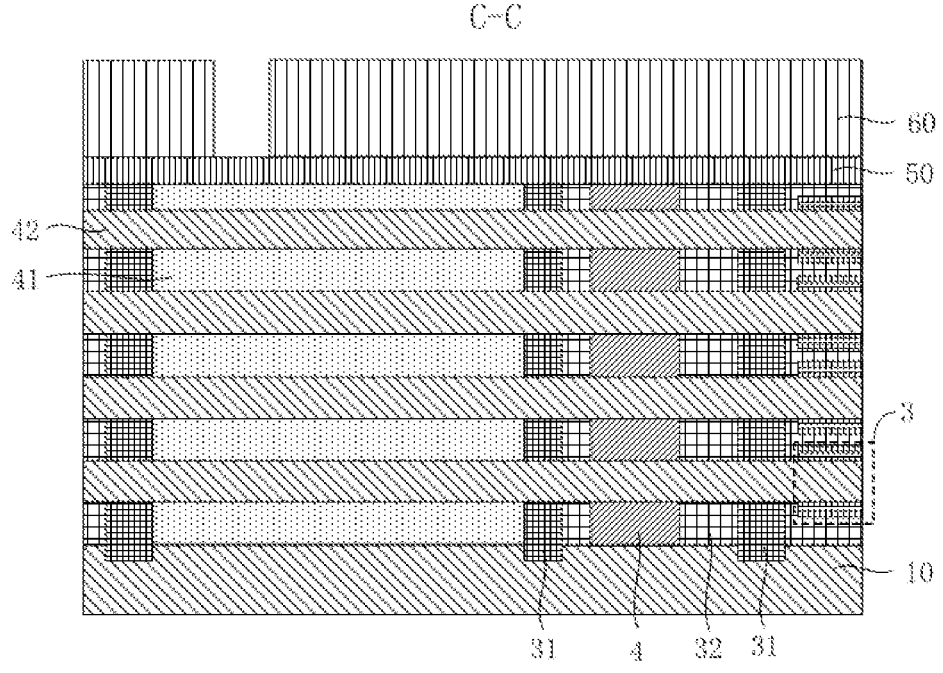
FIG. 9 is a schematic structural diagram of a cross section taken along C-C after the second stacked structure is formed according to an embodiment of the present disclosure.
Figure 10:
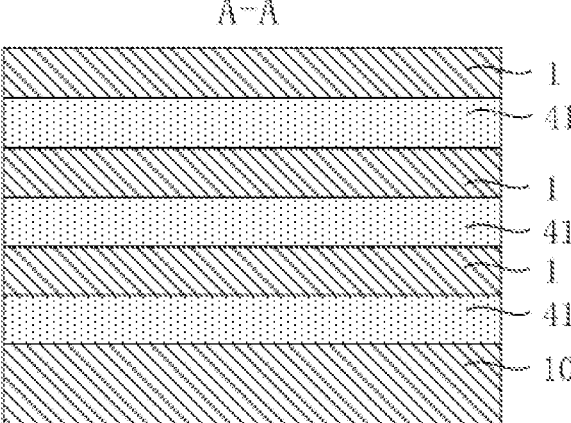
FIG. 10 is a schematic structural diagram of a cross section taken along A-A after a step is formed according to an embodiment of the present disclosure.
Figure 11:
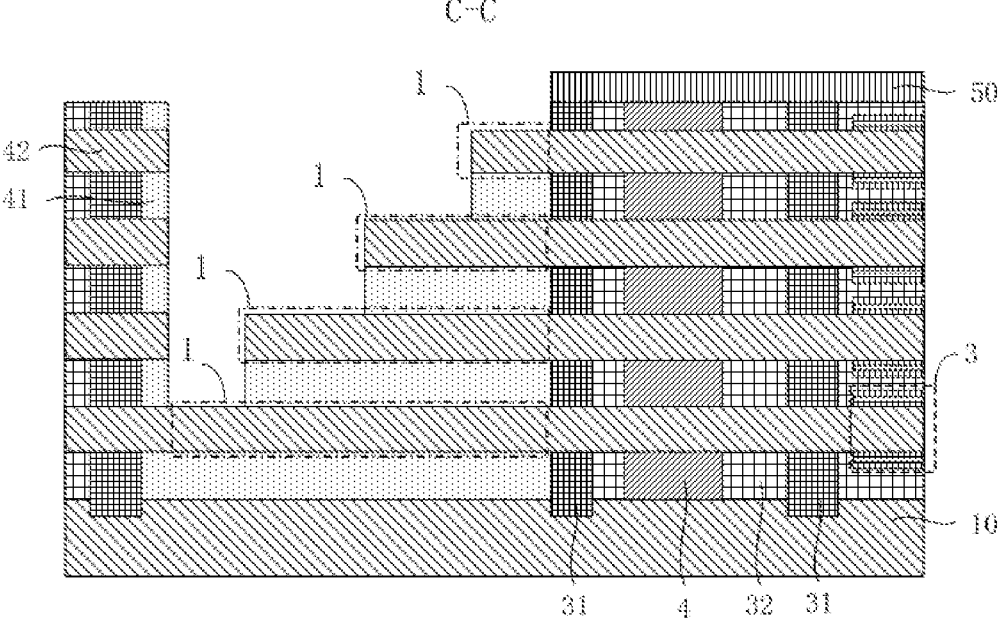
FIG. 11 is a schematic structural diagram of a cross section taken along C-C after the step is formed according to an embodiment of the present disclosure.
Figure 12:
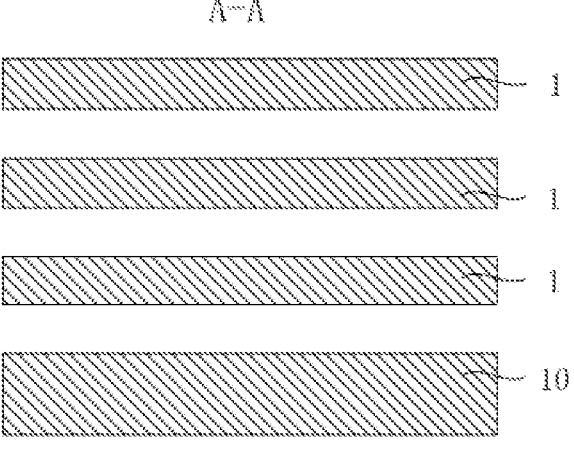
FIG. 12 is a schematic structural diagram of a cross section taken along A-A after a first sacrificial layer is removed according to an embodiment of the present disclosure.
Figure 13:
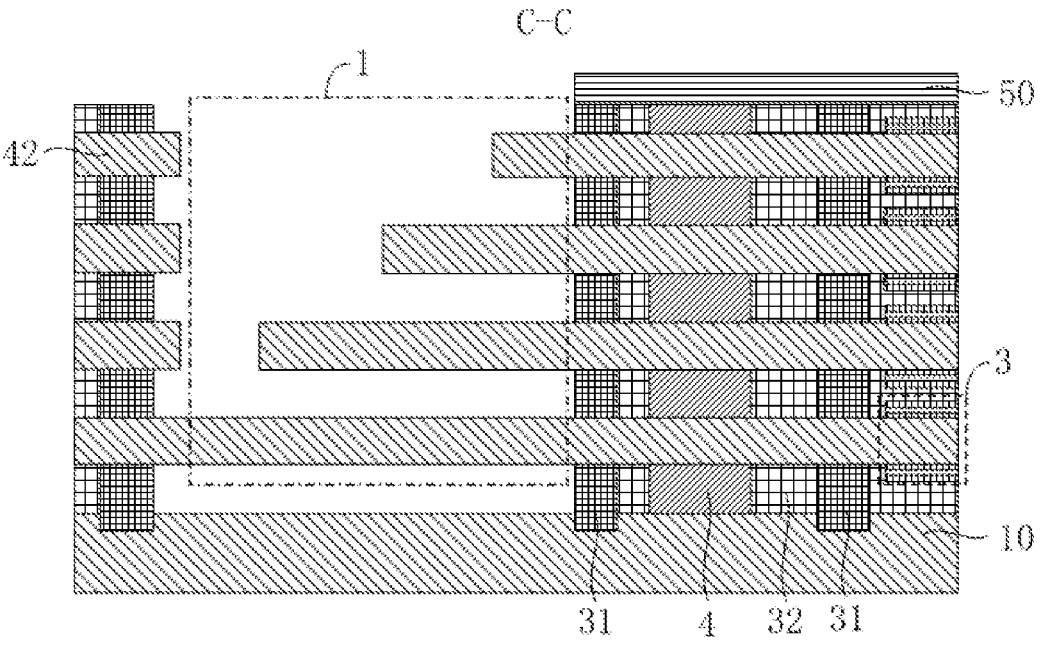
FIG. 13 is a schematic structural diagram of a cross section taken along C-C after the first sacrificial layer is removed according to an embodiment of the present disclosure.

With reference to FIGS. 7 to 9, the second stacked structure 40 includes a plurality of first sacrificial layers 41 and a plurality of first active layers 42. The plurality of first sacrificial layers 41 and the plurality of first active layers 42 are stacked alternately along the first direction. The first direction is perpendicular to the substrate 10. Along the first direction, a first active layer 42 is disposed between two adjacent first sacrificial layers 41, or the first sacrificial layer 41 is disposed between two adjacent first active layers 42, such that the first sacrificial layers 41 and the first active layers 42 are disposed sequentially and alternately In this arrangement, two adjacent first active layers 42 can be isolated by using the first sacrificial layer 41, to electrically isolate the first active layers 42 along the first direction. The material of the first active layer 42 includes silicon, and the material of the first sacrificial layer 41 includes silicon germanium.

Specifically, one first active layer 42 and one first sacrificial layer 41 are formed alternately in a repeated manner on the substrate 10 until the second stacked structure 40 is formed. For example, when the second stacked structure 40 is formed, one first active layer 42 is formed on the substrate 10, and then one first sacrificial layer 41 is formed on the first active layer 42. Next, one first active layer 42 is formed on the first sacrificial layer 41. The process of forming the first active layers 42 and the first sacrificial layers 41 is repeated until the required quantities of the first sacrificial layers 41 and the first active layer 42 are reached.

In some possible implementations, the first sacrificial layer 41 and the first active layer 42 may be formed through a deposition process, such as a chemical vapor deposition (CVD), a physical vapor deposition (PVD), an atomic layer deposition (ALD), or the like. In some other possible implementations, the first sacrificial layer 41 and the first active layer 42 may further be formed through an epitaxy (EPI) process.

Step S32: Remove a part of the first sacrificial layer and a part of the first active layer that are away from the first stacked structure, and take the remaining first active layer as a step in the first direction, to form the BL.

With reference to FIGS. 7 to 11, in some possible embodiments, a first mask layer 60 is formed on the second stacked structure 40. The size of the first mask layer 60 is gradually confined to etch the first sacrificial layer 41 and the first active layer 42, such that the first active layers 42 form steps.

Specifically, in some possible examples, the first mask layer 60 is first formed on the first stacked structure and the second stacked structure 40, and the first mask layer 60 formed on the second stacked structure 40 has a pattern required, to expose a part of the second stacked structure 40. The first mask layer 60 is used as a mask, to etch the bottommost first sacrificial layer 41 and first active layer 42, such that bottommost first active layer 42 forms a BL 1. Then, a part of the first mask layer 60 away from the first is stacked structure is removed. The retained first mask layer 60 is used as a mask to etch the penultimate first sacrificial layer 41 and first active layer 42, such that the penultimate first active layer 42 form a BL 1. By parity of reasoning, the formation of the BLs 1 is continued until the topmost first active layer 42 forms a BL 1. The bottommost first active layer 42/first sacrificial layer 41 is closest to the substrate 10, and the topmost first active layer 42/first sacrificial layer 41 is farthest from the substrate 10.

Certainly, in some other possible examples, the first mask layer 60 is formed on the first stacked structure and the second stacked structure 40, and the first mask layer 60 formed on the second stacked structure 40 has a pattern required, to expose a part of the second stacked structure 40. Alternatively, the first mask layer 60 is used as a mask to etch the penultimate first sacrificial layer 41 and first active layer 42, that is, the bottommost first sacrificial layer 41 and first active layer 42 are of a whole structure. The bottommost first sacrificial layer 41 forms a BL 1. The subsequent process is similar with the foregoing example, and is not repeated herein.

Specifically, in some other possible examples, the first mask layer 60 is formed on the first stacked structure and the second stacked structure 40, and the first mask layer 60 formed on the second stacked structure 40 has a pattern required, to expose a part of the second stacked structure 40. Alternatively, the first mask layer 60 is used as a mask, to etch the topmost first sacrificial layer 41 and first active layer 42. A part of the first mask layer 60 away from the first stacked structure is removed, to confine the first mask layer 60. The confined first mask layer 60 is used as a mask to etch the second topmost first sacrificial layer 41 and first active layer 42. The processes of confining the first mask layer 60 and etching the first sacrificial layers 41 and the first active layers 42 are repeated, until the bottommost first sacrificial layer 41 and first active layer 42 are etched. In this case, the all first active layers form BLs 1. In the foregoing manufacturing process, the first sacrificial layer 41 and the first active layer 42 are etched by a same thickness, which is beneficial to forming the step.

Figure 14:
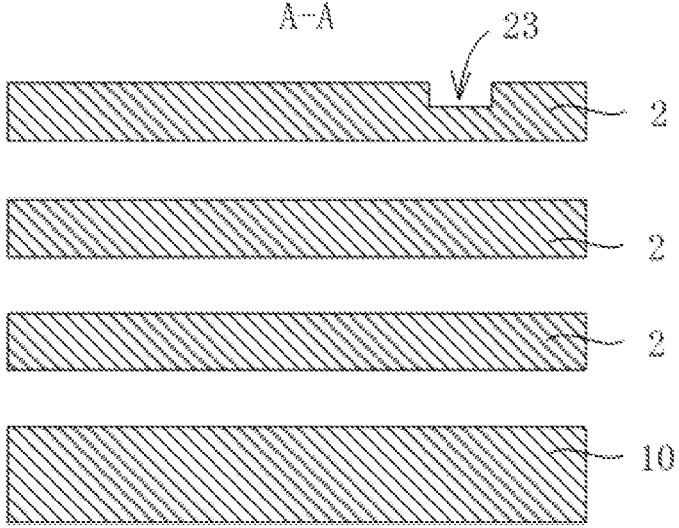
FIG. 14 is a schematic structural diagram of a cross section taken along A-A after a groove is formed according to an embodiment of the present disclosure.
Figure 15:
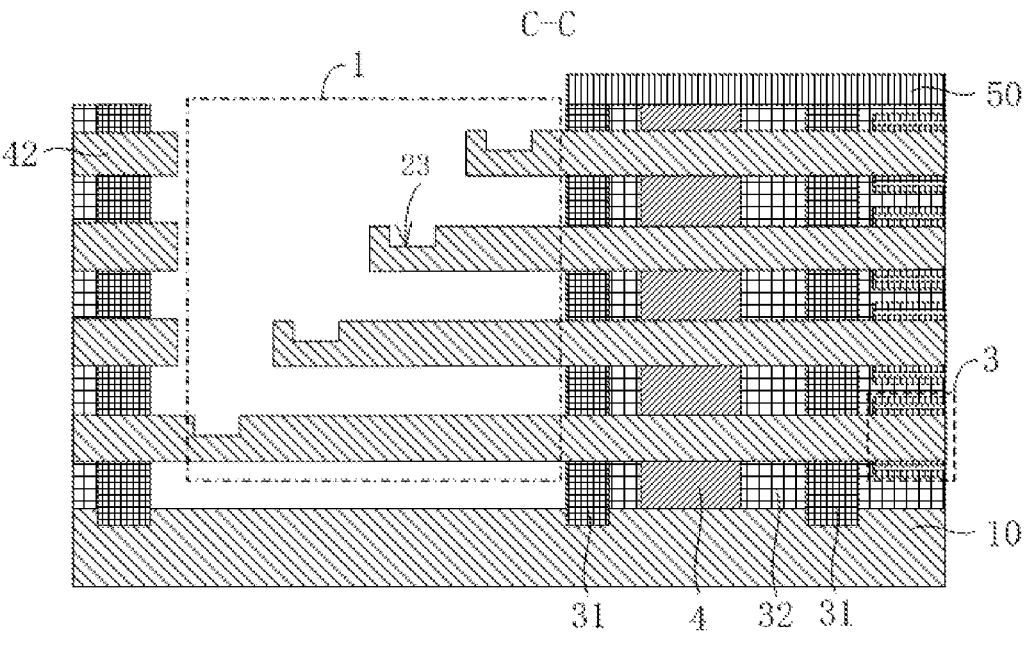
FIG. 15 is a schematic structural diagram of a cross section taken along C-C after the groove is formed according to an embodiment of the present disclosure.

It should be noted that, with reference to FIGS. 14 and 15, after the step of removing a part of the first sacrificial layer 41 and a part of the first active layer 42 that are away from the first stacked structure, taking the remaining first active layer 42 as a step in the first direction, to form the BL 1, each BL 1 is etched, such that the groove 23 is formed on the surface of the step of each BL 1.

It should be noted that before the first mask layer 60 is formed on the first stacked structure and the second stacked structure 40, a second protective layer 50 is formed thereon. The material of the second protective layer 50 is relatively hard. When the second stacked structure 40 is etched, the pattern on the first mask layer 60 is first transferred to the second protective layer 50. The patterned second protective layer 50 in the subsequent etching process can ensure the accuracy of transferred pattern. Then, the second stacked structure 40 is etched by using the patterned second protective layer 50, to improve the consistency between the pattern formed in the second stacked structure 40 and the pattern in the first mask layer 60, thereby improving the precision of the semiconductor structure.

Step S31: Remove the remaining first sacrificial layer.

With reference to FIGS. 10 to 13, after the BL 1 is formed, the remaining first sacrificial layer 41 is removed, to expose each BL 1. Specifically, the two opposite surfaces of the BL 1 along the first direction and the surface away from the first stacked structure are exposed, and therefore the exposed area of the BL 1 is relatively large, to facilitate subsequent doping of the BL 1.

In some possible embodiments, after the remaining first sacrificial layer 41 is removed, the method further includes: performing N-type or P-type doping on the BL 1, to decrease the resistance of the BL 1.

Specifically, the material of BL 1 includes silicon. The step of performing N-type or P-type doping on the BL 1 includes: under a vapor condition of phosphorus oxychloride ($POCl_3$), doping phosphorus atoms into the BL 1 by using a thermal diffusion process, and forming a phospho-silicate glass (PSG) on a surface of the BL 1; and removing the PSG, to expose the doped BL 1. Because the surface of the BL 1 is exposed, and especially two opposite surfaces of the BL 1 along the first direction are exposed, the two surfaces of the BL 1 may be doped simultaneously through the vapor doping, such that the BL 1 is doped deeper, to improve the doping efficiency and uniformity. The thermal diffusion process is performed at 800° C. to 1000° C. Then, the PSG is formed on the is surface of the BL 1. In this case, the PSG is removed by etching through hydrofluoric acid.

Step S40: Form a plurality of BL plugs arranged at intervals and extending along the first direction, where one end of each of the BL plugs is correspondingly disposed in the groove of one of the BLs.

With reference to FIGS. 2, 3, 4, 14, and 15, a plurality of BL plugs 5 are provided, extend along the first direction, and are arranged at intervals along the third direction, such that the BL plugs 5 are isolated from each other, to prevent the BLs 1 from interfering with each other. The plurality of BL plugs 5 are electrically connected to the plurality of BLs 1 in a one-to-one correspondence, and one end of each BL plug 5 is disposed in its corresponding groove 23. Specifically, one end of the BL plug 5 fills the groove 23. In this way, on the premise of keeping the thicknesses of the BLs 1 consistent, a contact area between the BL plug 5 and the BL 1 can be increased, thereby decreasing the contact resistance between the BL plug 5 and the BL 1, and improving the performance of the semiconductor structure.

In some possible implementations, with reference to FIG. 1, a plurality of BL plugs 5 are disposed in a same row along the third direction, and the plurality of BL plugs 5 occupy a small space along the second direction. With reference to FIG. 4, along a direction close to the transistor 2, the lengths of the plurality of BL plugs 5 are gradually reduced, such that the surfaces of the BL plugs 5 away from the substrate 10 are flush with each other, to connect the peripheral circuit.

In some other possible implementations, the plurality of BL plugs 5 are staggered along the second direction. With reference to FIG. 5, a connecting line of the plurality of BL plugs 5 and the second direction form an angle. In this way, the distance between adjacent BL plugs 5 is relatively large, and the mutual interference is small.

In some possible embodiments, after the step of forming the plurality of BL plugs 5 arranged at intervals and extending along the first direction, where one end of each of the BL plugs 5 is correspondingly disposed in the groove 23 of one of the BLs 1, the method further includes:

forming a first insulating layer 33 filling a space between the BLs 1, and forming a first protective layer 34 covering the BLs 1 and the first insulating layer 33; and forming a second insulating layer 35 filling a space between the BL plugs 5 and covering the first stacked structure, where a plurality of WL plugs 6 are arranged at intervals in the second insulating layer 35, and each of the WL plugs 6 is electrically connected to a WL 4.

Specifically, with reference to FIG. 4, the first protective layer 34 covers the BL 1 and the first insulating layer 33, to prevent the surface of the BL 1 away from the substrate 10 from being exposed, and isolate and protect the BLs 1. The first protective layer 34 is formed in a stepped shape and may be made of silicon nitride or silicon oxynitride. The second insulating layer 35 fills a space between two adjacent BL plugs 5, to further ensure the insulating performance between the BL plugs 5. The first insulating layer 33 and the second insulating layer 35 are made of silicon oxide.

A plurality of WL plugs 6 are arranged at intervals in the second insulating layer 35, and the plurality of WL plugs 6 are electrically connected to the plurality of WLs 4 in a one-to-one correspondence. The WL plug 6 extends along the first direction and is configured to connect the WL 4 to the peripheral circuit. The WL 4 has a first surface and a second surface that are arranged oppositely along the first direction. The first surface is away from the substrate 10, and the second surface is close to the substrate 10. Each WL plug 6 is in contact with the first surface of the corresponding WL 4, such that each WL 4 is led out through a different WL plug 6.

In conclusion, in the manufacturing method of a semiconductor structure provided by the embodiments of the present disclosure, the groove 23 is formed on the surface of the BL 1, and one end of the formed BL plug 5 is correspondingly disposed in the groove 23 of one BL 1, on the premise of keeping the thicknesses of the BLs 1 consistent, to increase the contact area between the BL 1 and the BL plug 5, and reduce the contact resistance between the BL 1 and the BL plug 5, thereby improving the performance of the semiconductor structure. In addition, vapor doping is subsequently performed on the BL 1, thereby doping the entire BL 1, and reducing the on-resistance of the BL 1 effectively, to further improve the performance of the semiconductor structure.

The embodiments or implementations of this specification are described in a progressive manner, and each embodiment focuses on differences from other embodiments. The same or similar parts between the embodiments may refer to each other. In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present disclosure. In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the foregoing embodiments are used only to explain the technical solutions of the present disclosure, but are not intended to limit the present disclosure. Although the present disclosure is described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the scope of the technical solutions of the embodiments of the present disclosure.

The invention claimed is:

1. A manufacturing method of a semiconductor structure, comprising:

forming a first stacked structure on a substrate, wherein the first stacked structure comprises a memory cell array;

forming, on the substrate, a plurality of word lines (WLs) arranged at intervals and extending along a first direction, wherein each WL penetrates through the first stacked structure and is electrically connected to the memory cell array;

forming, on the substrate, a plurality of bit lines (BLs) arranged at intervals and extending along a second direction, wherein each BL is disposed beside the first stacked structure, and is electrically connected to the memory cell array; and one end of each of the plurality of BLs away from the memory cell array forms a step in the first direction, each of the BLs is provided with a groove on a surface of the step, and the second direction and the first direction cross each other; and forming a plurality of BL plugs arranged at intervals and extending along the first direction, wherein one end of each of the BL plugs is correspondingly disposed in the groove of one of the BLs;

after the forming a plurality of BL plugs arranged at intervals and extending along the first direction, wherein one end of each of the BL plugs is correspondingly disposed in the groove of one of the BLs, the manufacturing method further comprises:

forming a first insulating layer filling a space between the BLs, and forming a first protective layer covering the BLs and the first insulating layer;

forming a second insulating layer filling a space between the BL plugs, wherein the second insulating layer further covers the first stacked structure; and forming a plurality of WL plugs arranged at intervals in the second insulating layer, wherein each of the WL plugs is electrically connected to one of the WLs.

2. The manufacturing method according to claim 1, wherein the forming, on the substrate, a plurality of BLs arranged at intervals and extending along a second direction, wherein each BL is disposed beside the first stacked structure, and is electrically connected to the memory cell array comprises:

forming a second stacked structure on the substrate, wherein the second stacked structure is located beside the first stacked structure; and the second stacked structure comprises a first sacrificial layer and a first active layer that are disposed alternately;

removing a part of the first sacrificial layer and a part of the first active layer that are away from the first stacked structure, and taking the remaining first active layer as a step in the first direction, to form the BL; and removing the remaining first sacrificial layer.

3. The manufacturing method according to claim 2, after the removing the remaining first sacrificial layer, the manufacturing method further comprises:

performing N-type or P-type doping on the BLs, to reduce a resistance of the BLs.

4. The manufacturing method according to claim 3, wherein a material of the BLs comprises silicon; and the performing N-type or P-type doping on the BLs, to reduce a resistance of the BLs comprises:

under a vapor condition of phosphorus oxychloride (POCl$_3$), doping phosphorus atoms into the BLs by a thermal diffusion process, and forming a phosphosilicate glass (PSG) on a surface of the BLs; and removing the PSG, to expose doped BLs.

5. The manufacturing method according to claim 4, wherein the thermal diffusion process is performed at 800° C. to 1000° C.; and the PSG is removed by etching through hydrofluoric acid.

* * * * *